US008749312B2

(12) United States Patent
Corral (10) Patent No.: US 8,749,312 B2
(45) Date of Patent: Jun. 10, 2014

(54) OPTIMIZING CASCADE GAIN STAGES IN A COMMUNICATION SYSTEM

(75) Inventor: Celestino A. Corral, Ocala, FL (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/449,956

(22) Filed: Apr. 18, 2012

(65) Prior Publication Data

US 2013/0278333 A1 Oct. 24, 2013

(51) Int. Cl.
*H03F 3/04* (2006.01)
(52) U.S. Cl.
USPC ........... 330/310; 330/149; 330/254; 330/150; 330/2
(58) Field of Classification Search
USPC ................. 330/310, 149, 150, 2, 302, 254; 455/226.1; 381/94.1, 71, 71.1
See application file for complete search history.

(56) References Cited

U.S. PATENT DOCUMENTS

| 3,371,284 | A | * | 2/1968 | Engelbrecht | 330/286 |
|---|---|---|---|---|---|
| 3,940,706 | A | | 2/1976 | Stegens | |
| 5,615,270 | A | * | 3/1997 | Miller et al. | 381/57 |
| 5,760,650 | A | * | 6/1998 | Faulkner et al. | 330/286 |
| 6,151,158 | A | * | 11/2000 | Takeda et al. | 359/337.12 |
| 6,768,472 | B2 | | 7/2004 | Alexopoulos et al. | |
| 6,903,612 | B2 | * | 6/2005 | Toncich et al. | 330/302 |
| 7,053,717 | B2 | * | 5/2006 | Gresham et al. | 330/310 |
| 7,199,664 | B2 | * | 4/2007 | Bult et al. | 330/284 |
| 7,376,407 | B2 | | 5/2008 | Womac | |
| 7,714,676 | B2 | | 5/2010 | McKinzie, III | |
| 7,795,990 | B2 | | 9/2010 | du Toit et al. | |
| 7,907,033 | B2 | | 3/2011 | Morris, III et al. | |
| 8,116,481 | B2 | * | 2/2012 | Christoph | 381/94.7 |
| 8,164,826 | B2 | * | 4/2012 | Tomita | 359/337.4 |
| 2009/0298422 | A1 | * | 12/2009 | Conroy et al. | 455/12.1 |
| 2009/0299742 | A1 | * | 12/2009 | Toman et al. | 704/233 |
| 2011/0037519 | A1 | | 2/2011 | Pletcher et al. | |

FOREIGN PATENT DOCUMENTS

| GB | 2390475 A | 1/2004 |
|---|---|---|
| WO | 2013158760 | 10/2013 |

OTHER PUBLICATIONS

International Search Report and Written Opinion—PCT/US2013/036970—ISA/EPO—Jul. 16, 2013.
Shinkawa K et al., "Low Noise Integrated SHF Converter for Satellite Tv Broadcasting", IEEE Transactions on Consumer Electronics, IEEE Service Center, New York, NY, US, vol. CE-32, No. 2, 1 May 1986, pp. 136-144, XP011158458.

* cited by examiner

*Primary Examiner* — Patricia Nguyen
(74) *Attorney, Agent, or Firm* — DeLizio Gilliam, PLLC (57) ABSTRACT

Techniques for optimizing a cascade gain device comprising at least two gain stages are disclosed. A first noise figure associated with the first gain stage is incrementally increased by a plurality of noise figure increments determined based, at least in part, on a minimum noise figure and a maximum noise figure associated with the first gain stage. At each of the plurality of noise figure increments, at least a gain value that corresponds to the noise figure increment is calculated. One of the plurality of noise figure increments and the corresponding gain value is selected as an optimum noise figure of the first gain stage and an optimum gain value of the first gain stage respectively. Parameters of an inter-stage matching network associated with the first gain stage are configured based on the optimum noise figure and the optimum gain of the first gain stage.

32 Claims, 6 Drawing Sheets

OPTIMIZING CASCADE GAIN STAGES IN A COMMUNICATION SYSTEM

TECHNICAL FIELD

Embodiments of the inventive subject matter generally relate to the field of cascade gain devices, and more particularly to implementing an optimized cascade gain amplifier in a communication system.

BACKGROUND

Optimizing noise and gain performance of radio frequency (RF) and microwave amplifiers is an important element of communication receiver design. A typical receiver amplifier can detect an incident received signal from an antenna and can amplify the signal's magnitude to improve the subsequent detection and signal processing. Amplification of the received signal can be accomplished using an amplifier, which increases the amplitude of the signal (or the signal power) while simultaneously minimizing the amount of additional noise added to the signal. Typically, low noise amplifiers (LNAs) can be used for increasing the signal power without concurrently increasing the noise. LNAs are typically implemented in cascaded stages to meet an overall gain requirement, wherein each stage can include one or more amplifiers. Cascading LNA stages can minimize the cascade noise, reduce power drain, and provide power limiting action to high-level inputs.

SUMMARY

Various embodiments for implementing an optimized cascade gain device are disclosed. In one embodiment, a first noise figure and a first gain associated with a first gain stage of the cascade gain device are determined. The cascade gain device comprises at least the first gain stage and a second gain stage. The first noise figure of the first gain stage is incrementally increased by a plurality of noise figure increments. The noise figure increments are determined based, at least in part, on a minimum noise figure and a maximum noise figure associated with the first gain stage. At each of the plurality of noise figure increments, at least a gain value that corresponds to the noise figure increment is calculated. One of the plurality of noise figure increments and the corresponding gain value is selected as an optimum noise figure of the first gain stage and an optimum gain value of the first gain stage respectively. One or more parameters of an inter-stage matching network associated with the first gain stage are configured based on the optimum noise figure of the first gain stage and the optimum gain of the first gain stage.

DETAILED DESCRIPTION OF EMBODIMENT(S)

The description that follows includes exemplary systems, methods, techniques, instruction sequences, and computer program products that embody techniques of the present inventive subject matter. However, it is understood that the described embodiments may be practiced without these specific details. For instance, although examples refer to optimization techniques for implementing a cascade gain device that minimizes the cascade noise figure, in other embodiments, the optimization techniques described herein can be employed for implementing a cascade gain device that minimizes the cascade noise temperature. In other instances, well-known instruction instances, protocols, structures, and techniques have not been shown in detail in order not to obfuscate the description.

A receiver unit of a communication system typically comprises multiple cascaded amplifier stages to amplify incoming received signals. By cascading multiple amplifiers, a large gain can be generated for high dynamic range input signals because implementing high gains in a single amplifier stage can increase the likelihood of oscillation. However, each of the amplifier stages in the cascade amplifier may be associated with amplifier noise. Amplifier noise can affect the signal-to-noise ratio of the signal provided to subsequent processing blocks and can consequently affect the performance of the communication system. Existing noise matching techniques typically strive to minimize the noise figure of the first stage of the cascade amplifier (e.g., a low noise amplifier (LNA)) by designing the input matching circuit for optimum noise levels. However, trade-offs in noise and power gain may need to be considered to preserve source matching requirements, to determine an optimal balance between noise and gain, and to improve overall system performance. Currently, trial-and-error techniques may be employed to investigate these trade-offs, but such techniques are inefficient, may not lead to an optimal solution, and may require a user to have absolute control over device features (e.g., geometric features of a transistor). Other techniques (e.g., optimization techniques, geometric programming techniques, etc.) that address optimization across multiple parameters simultaneously can be computationally intensive and may not provide insight into the critical design elements that achieve the best system performance. Currently, no general treatment of the gain/noise optimization problem of cascaded amplifier stages appears to have been undertaken.

In some embodiments, a mechanism can be employed for implementing an optimized cascade gain device (e.g., a cascade amplifier) with optimum gain and noise performance. As will be described below with reference to FIGS. 1-6, the gain and noise figures associated with individual gain stages of the multi-stage cascaded gain device can be considered to be a degree of freedom (e.g., a parameter) in the design of the optimized cascade gain device. In some embodiments, the optimum source and load reflection coefficients can be determined by minimizing the cascade noise figure (with a slight increase in cascade gain) or by maximizing the cascade gain (without affecting the cascade noise figure). Matching networks between two gain stages ("inter-stage matching network") can be designed/adjusted to incorporate the optimum source reflection coefficient and the optimum load reflection coefficient. By modifying the source reflection coefficient, the gain of the first gain stage of the cascade gain device can be increased thus reducing the noise contribution of the second gain stage. The optimum load reflection coefficient can then be calculated based, at least in part, on the optimum source reflection coefficient for a desired cascade noise figure and cascade gain. Such a technique for designing multi-stage cascade gain devices can strike an optimal balance between amplifier noise and gain, thus improving system performance.

The following discussion will first describe cascade noise figure considerations and calculations before describing the system and flows for optimizing noise figure and power gain for a cascade amplifier (FIGS. 1-6). The noise figure of an amplifier can typically be described as a change in the signal-to-noise (SNR) ratio of a received signal (e.g., the change in quality of the received signal because of the effect of the amplifier). The noise figure (F) of an M-stage cascaded amplifier can be expressed by Friis' formula depicted by Eq. 1.

$$F = F_1 + \frac{F_2 - 1}{G_1} + \frac{F_3 - 1}{G_1 G_2} + \ldots + \frac{F_M - 1}{G_1 G_2 \ldots G_{M-1}} \quad \text{Eq. 1}$$

In Eq. 1, $F_i$ and $G_i$ are the noise figure and gain of the $i^{th}$ amplifier stage of the cascade amplifier. The noise figures and gains of each of the amplifier stages may be considered to be degrees of freedom. In some embodiments, increasing the gain of the $i^{th}$ amplifier stage may result in an increase in the noise figure of $(i+1)^{th}$ amplifier stage but may decrease the noise contribution of the $(i+1)^{th}$ amplifier stage to the noise figure of the cascade amplifier.

For a two-stage cascade amplifier (i.e., M=2), the amplifier with the lowest noise figure is typically implemented as the first stage of the cascade amplifier because it has a lower noise measure. As such, let $F_1$ ($G_1$) and $F_2$ ($G_2$) be the noise figures (associated gains) of the first and second amplifier stages, respectively, with $F_1 < F_2$. To increase the gain of the first amplifier stage to some level $G_{1'} = bG_1$ with $b > 1$, the noise figure of the first amplifier stage may also be increased to some level $F_{1'} = aF_1$ with $a > 1$. If the overall noise figure of the cascade amplifier ("cascade noise figure") should not be increased, then the solution must satisfy the condition of Eq. 2.

$$F_{1'} + \frac{F_2 - 1}{G_{1'}} = aF_1 + \frac{F_2 - 1}{bG_1} \leq F_1 + \frac{F_2 - 1}{G_1} \quad \text{Eq. 2}$$

Eq. 2 can be further rearranged and simplified to yield Eq. 3 where $\gamma$ is a constant defined by Eq. 4. Eq 3 relates the noise increment a (of the first amplifier stage) to the gain increment b (of the first amplifier stage) through the initial noise figures ($F_1$, and $F_2$) of the first and the second amplifier stages and the initial gain ($G_1$) of the first amplifier stage.

$$\frac{1}{b} \leq 1 - (a-1)\gamma \text{ or } \frac{b-1}{b} \geq (a-1)\gamma \quad \text{Eq. 3}$$

$$\gamma = \frac{G_1 F_1}{F_2 - 1} \quad \text{Eq. 4}$$

As depicted with reference to Eq. 4, the performance of the cascade amplifier can be improved by adjusting the noise figure of the second amplifier stage (i.e., the value of $F_2$). In other words, decreasing the value of $F_2$ increases the gain increment (b) of the first amplifier stage for any fixed noise figure increment (a) of the first gain stage. The minimum value of the noise figure of the second amplifier stage ($F_2$) can be expressed by Eq. 5.

$$F_2 \geq \left(\frac{b}{b-1}\right)(a-1)G_1 F_1 + 1 \quad \text{Eq. 5}$$

Although Eq. 5 indicates that noise figure ($F_2$) of the second amplifier stage does not have an upper limit, a constraint $\gamma > 1$ can be imposed to ensure that there is no excess noise at the second amplifier stage. Accordingly, the upper limit on the noise figure of the second amplifier stage ($F_2$) can be expressed by Eq. 6.

$$F_2 < G_1 F_1 + 1 \quad \text{Eq. 6}$$

Combining Eq. 5 and Eq. 6, it can be determined that the gain increment (b) for the first amplifier stage should be greater than the noise figure increment (a) for the first amplifier stage (i.e., b>a). Accordingly, using the expression for $\gamma$ from Eq. 4, the gain increment (b) can be bound in accordance with Eq. 7 while the noise figure increment (a) can be bound in accordance with Eq. 8. In Eq. 8, $b_{min}$ is the lower bound on the gain increment (b) such that $b \geq b_{min}$.

$$b \geq \frac{1}{1 + \gamma(1-a)} \quad \text{Eq. 7}$$

$$a \leq 1 + \frac{b_{min} - 1}{b_{min} \gamma} \quad \text{Eq. 8}$$

If Eq. 8 is not satisfied, then it may not be possible to increase the gain of the first amplifier stage without increasing the cascade noise figure (i.e., the overall noise figure of the cascade amplifier). However, it should be noted that the evaluation of Eq. 8 is predicated upon two factors. The first factor is that because the gain increment (b) of the first amplifier stage is bound by $b_{min}$, as $b_{min}$ increases, $a \rightarrow 1 + 1/\gamma$. The second factor is that the factor $\gamma$ may only be adjusted through $F_2$. In other words, $\gamma$ may be varied only if $F_2$ is a degree of freedom.

To determine the conditions under which the cascade amplifier satisfies Eq. 2, we represent $b = \mu a$ where $\mu > 1$. Substituting this representation of the gain increment of the first amplifier stage into Eq. 3 results in Eq. 9. Furthermore, rearranging and solving for $\mu$ results in Eq. 10.

$$a - 1/\mu \geq a(a-1)\gamma \quad \text{Eq. 9}$$

$$\mu \geq \frac{1}{a[1 - (a-1)\gamma]} \quad \text{Eq. 10}$$

From Eq. 10, the value of $\mu$ depends on the selected value of the noise figure increment (a) for the first amplifier stage and the second stage noise figure ($F_2$) (establishing $\gamma$). To ensure that the denominator of Eq. 10 is positive, the condition in Eq. 11 should be satisfied.

$$1 < \gamma < \frac{1}{a-1}$$ Eq. 11

Accordingly, the noise figure increment (a) for the first amplifier stage can be chosen to find the corresponding $(\gamma,\mu)$ pair.

It should be noted that in the design of the optimized cascade amplifier, matching networks between two amplifier stages may be modified and this can result in an increase in the noise figure of the second amplifier stage. Therefore, Eq. 2 can be modified to reflect this condition, as depicted by Eq. 12 where $F_{2'}=cF_2$ and $c>1$. Eq. 12 can be solved to yield the gain increment (b) of the first amplifier stage as depicted by Eq. 13.

$$F_{1'} + \frac{F_{2'}-1}{G_{1'}} = aF_1 + \frac{cF_2-1}{bG_1} \le F_1 + \frac{F_2-1}{G_1}$$ Eq. 12

$$b \ge \left(\frac{cF_2-1}{F_2-1}\right)\frac{1}{1-(a-1)\gamma}$$ Eq. 13

It is noted that Eq. 13 reduces to Eq. 3 when $c=1$. When $c>1$ the gain increment (b) of the first amplifier stage may be higher due to the noise increase of the second amplifier stage.

Designing a minimum noise amplifier can comprise setting the source reflection coefficient ($\Gamma_S$) to be the reflection coefficient ($\Gamma_O$) that corresponds to the minimum noise figure $F_{min}$. The load reflection coefficient ($\Gamma_L$) for maximum power transfer can be calculated in accordance with Eq. 14.

$$\Gamma_L = \Gamma_{OUT}^* = \left[S_{22} + \frac{S_{12}S_{21}\Gamma_S}{1-S_{11}\Gamma_S}\right]^*$$ Eq. 14

In Eq. 14, $S_{1j}$ are the S-parameters of the first amplifier stage (e.g., the biased transistor that constitutes the first amplifier stage) and * is the complex conjugate operator. Setting the load reflection coefficient ($\Gamma_L$) in accordance with Eq. 14 can reduce the noise figure, increase input voltage standing wave ratio (VSWR), and reduce output VSWR for the matching network. Amplifier stability can be determined by determining an amplifier stability factor (K) based on the S-parameters of the first amplifier stage. Amplifier stability can be determined by checking whether the condition of Eq. 15 is satisfied. The parameter $\Delta_S$ can be calculated in accordance with Eq. 16.

$$K = \frac{1-|S_{11}|^2-|S_{22}|^2+|\Delta_S|^2}{2|S_{12}S_{21}|} > 1$$ Eq. 15 and $$|\Delta_S| < 1$$

$$\Delta_S = S_{11}S_{22} - S_{12}S_{21}$$ Eq. 16

In some embodiments, a more compact evaluation of stability can be made by analysing a single stability parameter ($\rho$) as depicted below in Eq. 17.

$$\rho = \frac{1-|S_{11}|^2}{|S_{22}-S_{11}^*\Delta_S|+|S_{12}S_{21}|} > 1$$ Eq. 17

While designing the cascade amplifier, stringent matching requirements or performance specifications for the cascade amplifier may result in the need for trading off noise and gain in the cascaded amplifier stages. As described above in Eq. 1-Eq. 13, such trade-offs may result in a low noise solution with superior gain. As such, it may be desirable to optimize gain and noise for a transistor amplifier with noise performance de-tuned from its minimum noise.

Figure 5:
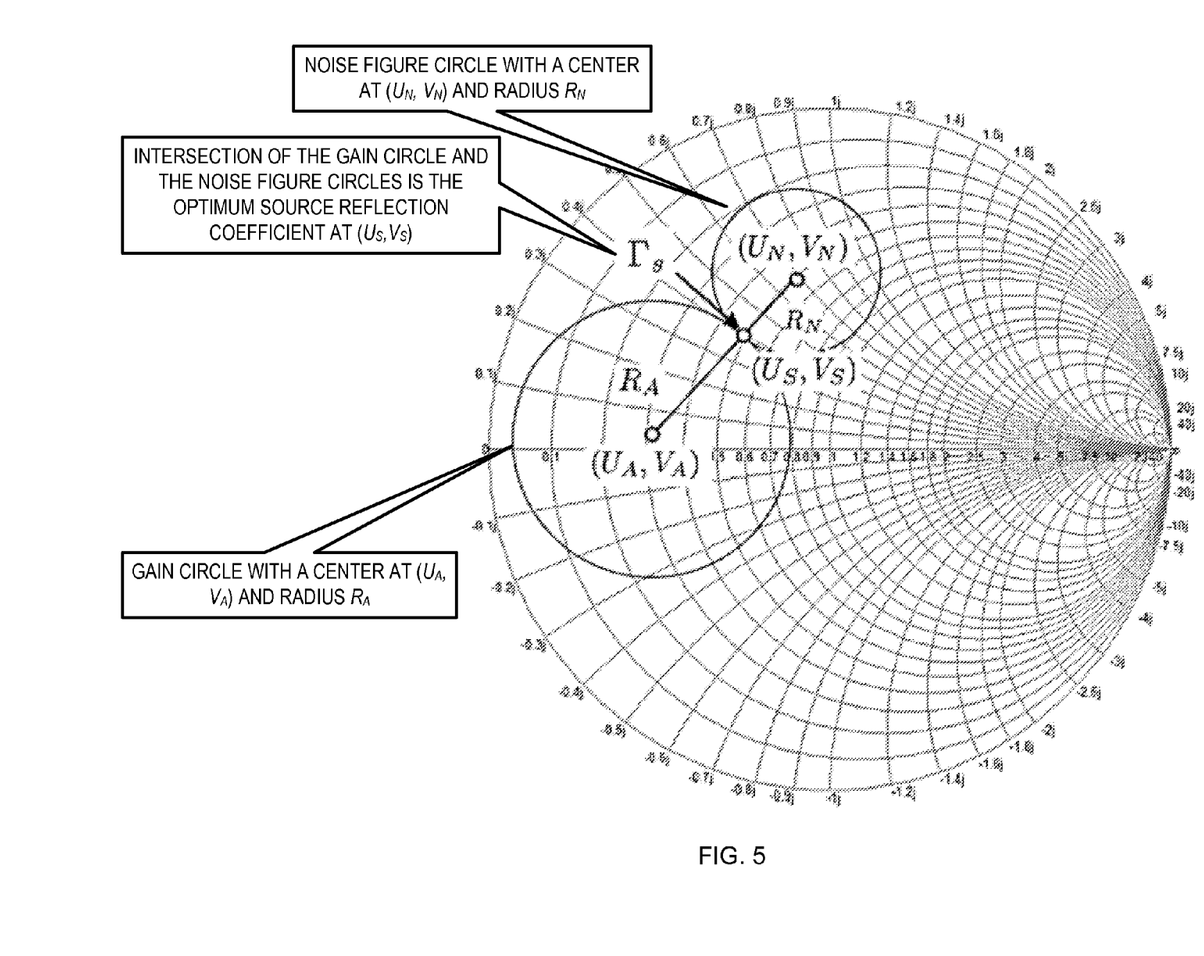
FIG. 5 depicts the relationship between a gain circle and a noise figure circle on a Smith chart.

The available power gain ($G_A$) can be described as the ratio of power ($P_{AV,N}$) available from the network to the ratio of the power ($P_{AV,S}$) available from the source (e.g., the input power), as expressed by Eq. 18 and Eq. 19a. The value of $C_1$ can be calculated in accordance with Eq. 19b.

$$G_A = \frac{P_{AV,N}}{P_{AV,S}} = |S_{21}|^2 g_A$$ Eq. 18

$$g_A = \frac{1-|\Gamma_S|^2}{1-|S_{22}|^2+|\Gamma_S|^2(|S_{11}|^2-|\Delta_S|^2)-2\Re[\Gamma_S C_1]}$$ Eq. 19a $$C_1 = S_{11} - \Delta_S S_{22}^*$$ Eq. 19b For the unconditionally stable bilateral case, the center of available gain circles in a Smith Chart can be determined using Eq. 20 and Eq. 21. A gain circle refers to a locus of points with a different noise figure but a constant gain value, as depicted in FIG. 5. In Eq. 20, the center of the gain circles is represented as ($U_A$, $V_A$). The expression $\Re[C_1^*]$ refers to the real part of $C_1^*$ while the expression $\Im[C_1^*]$ refers to the imaginary part of $C_1^*$. $C_1$ can be expressed as a combination of the S-parameters of the first amplifier stage in accordance with Eq. 19b.

$$U_A = g_A \Re[C_1^*]/\Psi \text{ and } V_A = g_A \Im[C_1^*]/\Psi$$ Eq. 20

$$\Psi = 1 + g_A(|S_{11}|^2 - |\Delta_S|^2)$$ Eq. 21

The radius of the gain circles (on the Smith Chart) for the unconditionally stable bilateral case can be expressed in accordance with Eq. 22.

$$R_A = [1 - 2K|S_{12}S_{21}|g_A + |S_{12}S_{21}|^2 g_A^2]^{1/2}/|\Psi|$$ Eq. 22

The value of the amplifier stability factor (K) for the first amplifier stage can be determined using Eq. 15. The maximum gain occurs when the radius of the gain circle is $R_A = 0$. The maximum gain value ($g_{A,max}$) can be expressed by Eq. 23.

$$g_{A,max} = \frac{1}{|S_{12}-S_{21}|}\left(K - \sqrt{K^2-1}\right)$$ Eq. 23

If the first amplifier stage has a noise figure $F_i \ge F_{min}$ then the corresponding noise figure parameter ($N_i$) of the first amplifier stage can be expressed by Eq. 24. It is noted that $N_i$ represents the $i^{th}$ noise factor of the first amplifier stage as a result of increasing the noise figure of the first amplifier stage from $F_{min}$ to a new value $F_i$ that is greater than $F_{min}$.

$$N_i = \frac{|\Gamma_S - \Gamma_O|^2}{1 - |\Gamma_S|} = \frac{F_i - F_{min}}{4r_n}|1 + \Gamma_O|^2 \qquad (24)$$

In Eq. 24, $\Gamma_S$ is the source reflection coefficient, $\Gamma_O$ is the source reflection coefficient that corresponds to the minimum noise figure $F_{min}$, and $r_n$ is the normalized noise resistance of a two-port device (e.g., a transistor of the first amplifier stage, etc.). Solving Eq. 24 yields a family of noise figure circles with centers that can be determined from Eq. 25. A noise circle refers to a locus of points with a different gain value but a constant noise figure, as depicted in FIG. 5. In Eq. 25, the center of the noise figure circles is represented as $(U_N, V_N)$. The expression $\mathfrak{R}[\Gamma_O]$ refers to the real part of $\Gamma_O$ while the expression $\mathfrak{I}[\Gamma_O]$ refers to the imaginary part of $\Gamma_O$. In Eq. 25, $Y=1+N_i$. Additionally, the radii of the noise figure circles ($R_N$) can be expressed by Eq. 26.

$$U_N = \mathfrak{R}[\Gamma_O]/Y, V_N = \mathfrak{I}[\Gamma_O]/Y \qquad \text{Eq. 25}$$

$$R_N = \sqrt{N_i^2 + N_i(1 - |\Gamma_O|^2)}\Big/Y \qquad \text{Eq. 26}$$

When the noise figure is at its minimum value $F_{min}$, the source reflection coefficient $\Gamma_S = \Gamma_O$ and the noise figure parameter $N_i = 0$. From Eq. 25 and Eq. 26, when the noise figure is at its minimum value, this results in a circle with zero radius ($R_N = 0$).

To design the $i^{th}$ amplifier stage for a maximum gain value at a noise figure $F_i > F_{min}$, the point common to a noise figure circle (represented by Eq. 20 and Eq. 22) and an available power gain circle (represented by Eq. 25 and Eq. 26) may be determined for a given noise figure parameter $N_i$. If $g_{A,max}$ represents the upper bound of the gain of the amplifier stage (expressed by Eq. 23), the lower bound can be set to any suitable small value, such that $G_{A,low}/|S_{21}|^2 < g_{A,max}$. To determine the point common to a noise figure circle and a power gain circle for a given noise figure parameter, the gain value $g_{A,opt}$ that satisfies the condition of Eq. 27 can be determined.

$$(U_N - U_A)^2 + (V_N - V_A)^2 = (R_A^2 + R_N^2) \qquad \text{Eq. 27}$$

In some embodiments, a bisection method may be used to determine an optimal value of gain $g_{A,opt}$ that satisfies Eq. 27 for the selected noise figure $N_i$. To determine the corresponding source reflection coefficient ($\Gamma_S$), the geometric relations of the gain circles and the noise figure circles can be leveraged to solve for the tangent point at $(U_S, V_S)$. In some embodiments, the tangent point at $(U_S, V_S)$ can be determined by solving the non-linear equations Eq. 28 and Eq. 29. The source reflection coefficient ($\Gamma_S$) can then be expressed as $\Gamma_S = U_S + jV_S$.

$$(U_S - U_A)^2 + (V_S - V_A)^2 = R_A^2 \qquad \text{Eq. 28}$$

$$(U_N - U_S)^2 + (V_N - V_S)^2 = R_N^2 \qquad \text{Eq. 29}$$

In some embodiments, Eq. 28 and Eq. 29 can be solved using Newton type techniques such as trust-region, Broyden method, secant method, Halley method, and/or their combinations. In another embodiment, simulation software (e.g., MATLAB's "fsolve" function) may also be used to solve Eq. 28 and Eq. 29. Alternately, other suitable techniques can be employed for determining the tangent point on the Smith chart (i.e., determining the point on the Smith chart that is common to both the gain circle and the noise figure circle). The end result is a triplet ($F_{i,opt}, G_{A,opt}, \Gamma_{s,opt}$) that indicates the optimal noise figure of the first amplifier stage $F_{i,opt}$, the corresponding maximum available power gain $G_{A,opt}$, and the optimal source reflection coefficient $\Gamma_{s,opt}$. The maximum available power gain $G_{A,opt}$ can be calculated as $G_{A,opt} = g_{A,opt}|S_{21}|^2$ and $g_{A,opt}$ is computed from the solution to Eq. 27. It is noted that $F_{i,opt}$ represents the optimum noise figure of the first amplifier stage at the $i^{th}$ iteration.

Thus, if the optimum noise figure for the first amplifier stage can be represented in terms of the minimum noise figure as $F_{i,opt} = aF_{min}$ and if the optimum maximum available power gain can be represented in terms of the available power gain as $G_{A,opt} = bG_A$, the cascade amplifier can be optimized by determining the values of a and b that 1) correspond to a minimum cascade noise figure or 2) correspond to the maximum available power gain with no increase in cascade noise relative to the non-optimized design. Mathematically, the optimized cascade amplifier solution ("minimum cascade noise condition") that corresponds to the minimum cascade noise ($F_{tot,min}$) can be expressed by Eq. 30. Alternately, the optimized cascade amplifier solution ("maximum cascade gain condition") that corresponds to the maximum available power gain with no increase in cascade noise relative to the non-optimized design can be expressed by Eq. 31. It should be noted that the values of a and b that satisfy the minimum cascade noise condition may be different from the values of a and b that satisfy the maximum cascade gain condition.

$$\text{Find } (a, b) \text{ such that } aF_{min} + \frac{F_2 - 1}{bG_A} = \text{minimum} \qquad \text{Eq. 30}$$

$$\text{Find } (a, b) \text{ such that } aF_{min} + \frac{F_2 - 1}{bG_A} = F_{min} + \frac{F_2 - 1}{G_A} \qquad \text{Eq. 31}$$

If the noise figure reduction of the minimum cascade noise design is modest, the optimization may be focused on maximizing the available power gain, thus easing the requirement for additional gain in the following amplifier stages.

Figure 1:
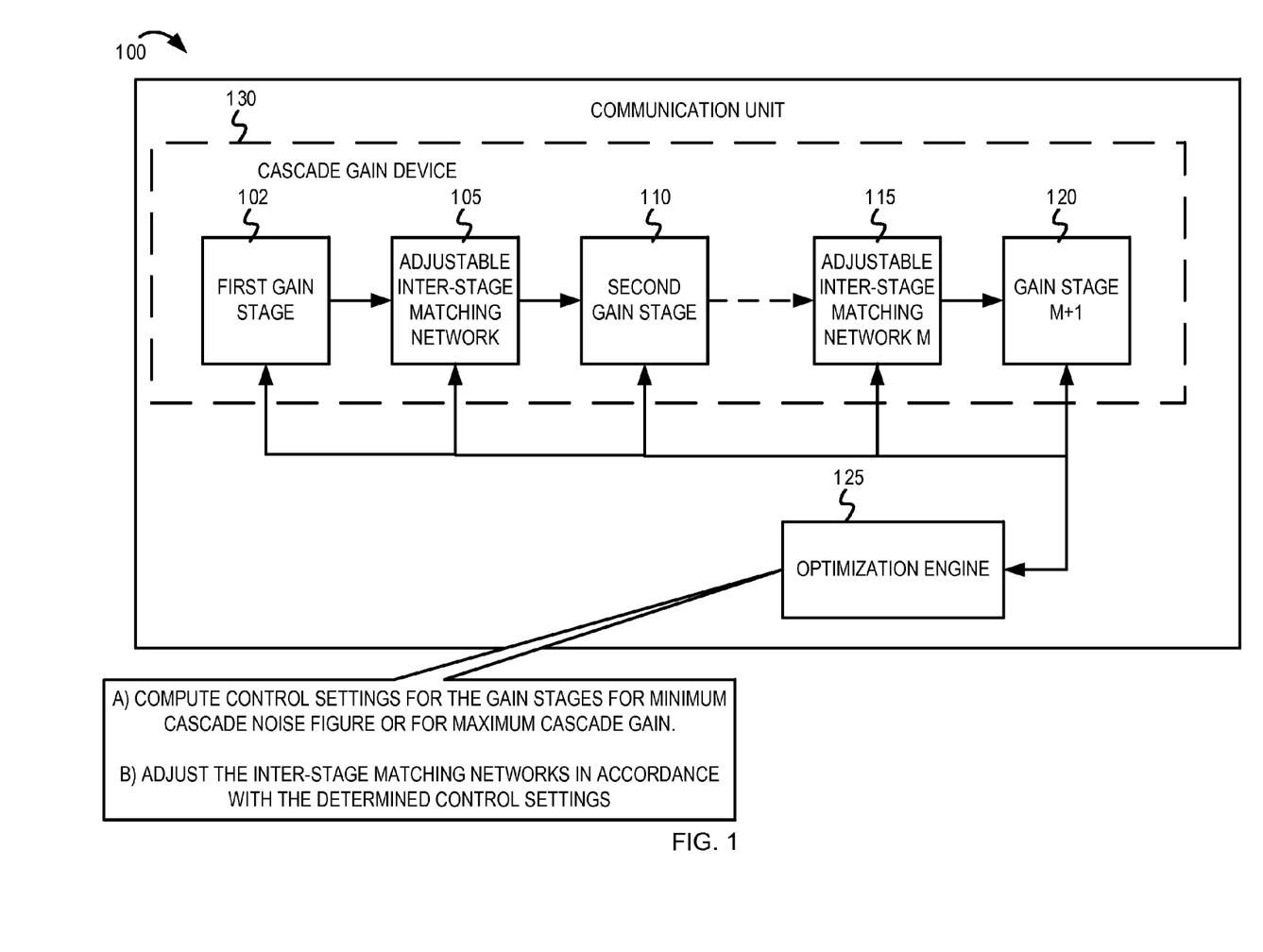
FIG. 1 depicts an example block diagram of a communication unit including a mechanism for implementing an optimized cascade gain device.

FIG. 1 depicts an example block diagram of a communication unit 100 including a mechanism for implementing an optimized cascade gain device. The communication unit 100 may be part of a receiver unit of an electronic device (e.g., laptop computer, a tablet computer, a mobile phone, a smart appliance, a gaming console, an access point, a powerline device, etc.) with communication capabilities. The communication unit 100 can implement protocols and functionality to enable communication between the electronic device and other suitable communication devices. As depicted in FIG. 1, the communication unit 100 comprises a cascade gain device 130 including a first gain stage 102, a second gain stage 110, and an (M+1)$^{th}$ gain stage 120. Each gain stage is coupled with the next gain stage via an adjustable inter-stage matching network. With reference to FIG. 1, the first gain stage 102 is coupled with the second gain stage 110 via an adjustable inter-stage matching network 105. The M$^{th}$ gain stage (not shown) is coupled with the (M+1)$^{th}$ gain stage 120 via an adjustable inter-stage matching network 115. The first gain stage 102 can be associated with a first noise figure, the second gain stage 110 can be associated with a second noise figure, and so on. As described above, the cascade noise figure of the combination of the first gain stage 102 and the second gain stage 110 can be described as the combination of the first noise figure of the first gain stage and a second noise figure contribution from the second gain stage when the first gain stage is operating at the first noise figure. The communication unit 100 also comprises an optimization engine 125. The optimization engine 125 can execute operations described above and in FIGS. 2-5 for determining an optimum noise figure of the first gain stage 102, a corresponding optimum gain of the first gain stage 102 associated with the optimum noise figure, and corresponding source and reflection coefficients. As described herein, the optimum noise figure of the first gain stage 102 can be determined by incrementally increasing the first noise figure of the first gain stage 102, thereby decreasing the second noise figure contribution from the second gain state 110, until the optimized cascade gain device has either a minimum cascade noise figure or a maximum cascade gain. The optimization engine 125 is further coupled to the gain stages 102, 110, and 120 and also to the adjustable inter-stage matching networks 105 and 115. The optimization engine 125 can adjust the adjustable inter-stage matching networks 105 and 115 to achieve the optimum noise figure of the first gain stage 102 and the optimum gain of the first gain stage 102. In some embodiments, the optimization engine 125 can comprise a control unit that dynamically tunes the S-parameters and the reflection coefficients of the inter-stage matching networks 105 and/or 115 for optimum matching between consecutive gain stages. In other embodiments, the communication unit 100 can comprise a distinct control unit. The optimization engine 125 can compute the control settings for the different stages to ensure optimum matching between consecutive stages and can notify the control engine of the computed control settings.

Figure 2:
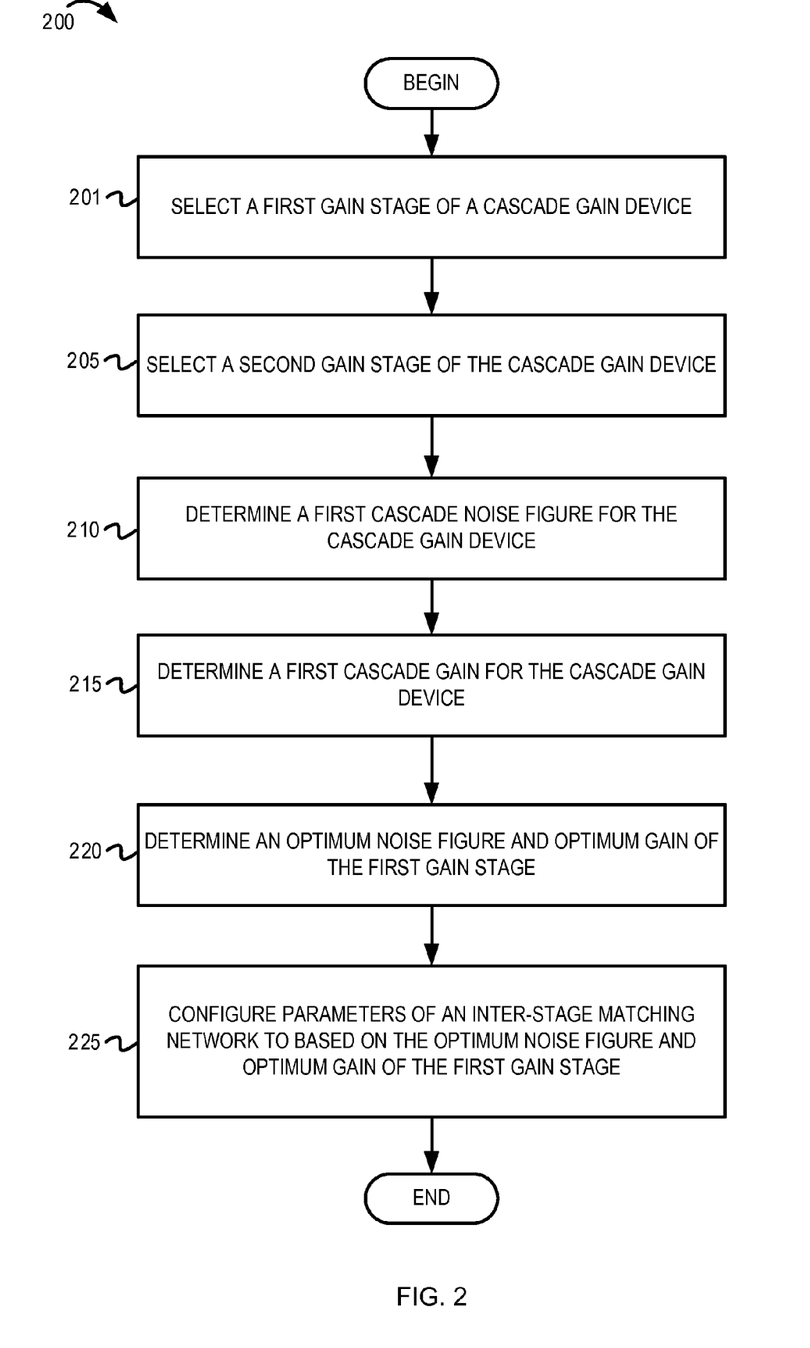
FIG. 2 is a flow diagram illustrating example operations for implementing an optimized cascade gain device.

FIG. 2 is a flow diagram ("flow") 200 illustrating example operations for implementing an optimized cascade gain device. The flow 200 begins at block 201.

At block 201, a first gain stage of a cascade gain device is selected. The first gain stage can have a first noise figure and a first gain that corresponds to the first noise figure. With reference to FIG. 1, the optimization engine 125 can select the first gain stage 102 of the cascade gain device 130. The flow continues at block 205.

At block 205, a second gain stage of the cascade gain device is selected. The second gain stage can be associated with a second noise figure. Selecting the first and the second gain stages can include identifying two consecutive amplifier stages of the cascade amplifier chain across which the optimization process should be performed. With reference to FIG. 1, the optimization engine 125 can determine that the optimization process should be performed for the first gain stage 102 and the second gain stage 110. After the first gain stage and the second gain stage have been selected, the flow continues at block 210.

At block 210, a first cascade noise figure is determined for the cascade gain device. With reference to FIG. 1, the cascade gain device 130 includes the first gain stage 102 and the second gain stage 110. The first cascade noise figure for the cascade gain device can be calculated as a combination of the first noise figure of the first gain stage and the second noise figure of the second gain stage, depicted with reference to Eq. 1. The flow continues at block 215.

At block 215, a first cascade gain is determined for the cascade gain device. For example, the optimization engine 125 can determine the first cascade gain of the first gain stage 102. The first cascade gain for the cascade gain device can be determined when the first gain stage is operating at the first noise figure. The flow continues at block 220.

At block 220, an optimum noise figure of the first gain stage and a corresponding optimum gain of the first gain stage is determined. For example, the optimization engine 125 can determine the optimum noise figure and the corresponding optimum gain of the first gain stage 102. To determine the optimum noise figure and optimum gain of the first gain stage 102, the first noise figure of the first gain stage 102 can be incrementally increased. This, in turn, results in a decrease in the second noise figure contribution from the second gain stage 110 due to the increase in the gain associated with the first gain stage 102. The first noise figure of the first gain stage 102 can be increased until the increased first noise figure of the first gain stage 102 in combination with the decreased second noise figure contribution from the second gain stage 110 results in either an optimized cascade gain device having a minimum cascade noise figure and a cascade gain that is greater than or equal to the first cascade gain, or an optimized cascade gain device having a maximum cascade gain and a cascade noise figure that is less than or equal to the first cascade noise figure.

To optimize the cascade gain device in accordance with the minimum cascade noise condition (as depicted by Eq. 30), the first noise figure can be incrementally increased by a thereby incrementally increasing the first gain b, until the first noise figure $aF_{min}$ of the first gain stage in combination with the noise figure contribution from the second gain stage $$\frac{F_2 - 1}{bG_A}$$

is at a minimum. This solution may or may not result in a slight increase in the cascade gain at the minimum cascade noise.

To optimize the cascade gain device in accordance with a maximum cascade gain condition (as depicted by Eq. 31), the first noise figure can be incrementally increased by a thereby incrementally increasing the first gain b, until the first noise figure $aF_{min}$ of the first gain stage in combination with the noise figure contribution from the second gain stage $$\frac{F_2 - 1}{bG_A}$$

is equal to $$F_{min} + \frac{F_2 - 1}{G_A}.$$

This solution corresponds to the maximum available power gain with no (or neglegible) increase in cascade noise relative to the non-optimized design. The flow then continues at block 225.

At block 225, parameters of an inter-stage matching network are configured based on the optimum noise figure and the optimum gain of the first gain stage. For example, after the optimum noise figure and the optimum gain of the first gain stage are determined (for the minimum cascade noise condition or the maximum cascade gain condition), the optimization engine 125 can configure one or more parameters of the inter-stage matching network (e.g., the adjustable inter-stage matching network 105) to achieve the optimum noise figure and the optimum gain of the first gain stage 102, thereby optimizing the cascade gain device 130. In some embodiments, the optimum noise figure and the optimum gain determined at block 220 can correspond to an optimum source reflection coefficient and an optimum load reflection coefficient. The source and the load reflection coefficients of the inter-stage matching network 105 can be adjusted accordingly to achieve the optimum noise figure and the optimum gain of the first gain stage 102. In some embodiments, the inter-stage matching network 105 may comprise tunable elements to adjust the reflection coefficients between the gain stages after fabrication of the integrated circuit devices forming the cascade gain device. This embodiment can be considered to be a dynamic or configurable implementation (relative to an available circuit). In other embodiments, the adjustable inter-stage matching network 105 may be adjusted during the fabrication of the integrated circuit devices, thereby allowing one-time customization of the matching network. This embodiment can be considered to be a static implementation (relative to a manufacturing process). From block 225, the flow ends.

It should be noted that each gain stage of the cascade gain device with the exception of the first stage may comprise one or more low-noise amplifiers, transistor amplifiers, mixers, or combinations thereof. In a particular embodiment, the first gain stage is a low-noise amplifier and the first noise figure is a low-noise solution for the first gain stage, while the second stage may be a mixer, a filter, a coupler, or attenuator with loss instead of gain and associated noise figure. While FIG. 2 provided a high level overview of the operations for optimizing the cascade gain device, FIG. 3 and FIG. 4 will describe the operations for optimizing the cascade gain device in more detail.

Figure 3:
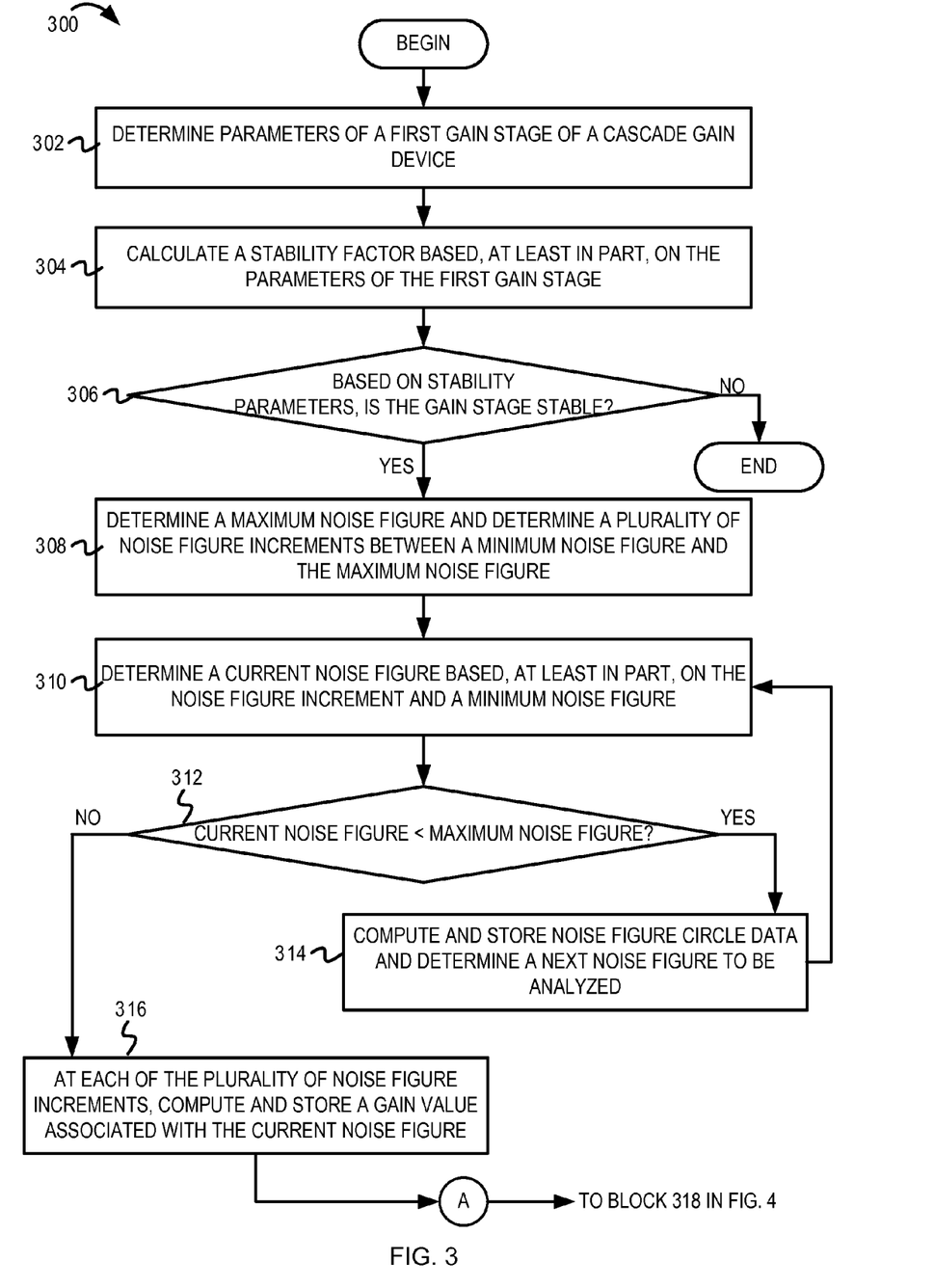
FIG. 3 is a flow diagram illustrating example detailed operations for optimizing a cascade gain device.
Figure 4:
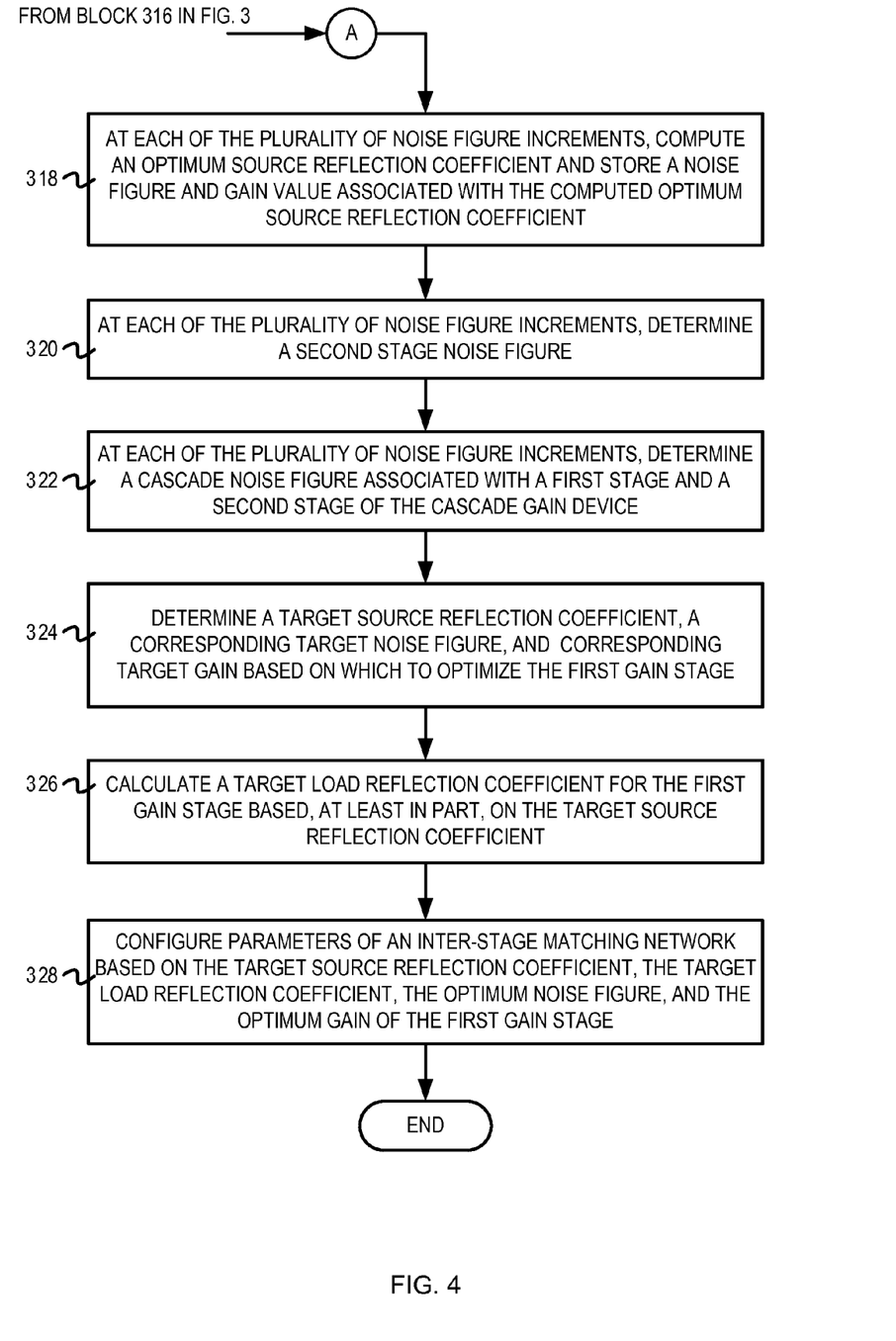
FIG. 4 is a continuation of FIG. 3 and also illustrates example detailed operations for optimizing a cascade gain device.

FIG. 3 and FIG. 4 depict a flow diagram 300 illustrating example detailed operations for optimizing a cascade gain device. The flow 300 begins at block 302 in FIG. 3.

At block 302, parameters of a first gain stage of a cascade gain device are determined. With reference to the example of FIG. 1, the optimization engine 125 can determine the parameters of the first gain stage 102 of the cascade gain device 130. The parameters of the first gain stage 102 can comprise scattering parameters (referred to as S-parameters) that are indicative of the ratio of reflected power to incident power at a terminal of the first gain stage. If there is no reflected power, all the power is incident (fully transferred) to the device and this is termed "matched." Typically, the S-parameters are inherent to the device (e.g., map to the physical characteristics of the first gain stage) and may be specified (e.g., by a device manufacturer) at a bias condition and a frequency range. A 2-port device (e.g., a transistor of the first gain stage) can have four S-parameter values denoted by $S_{11}$ $S_{12}$ $S_{21}$ $S_{22}$. The parameters of the first gain stage can also comprise noise parameters. The noise parameters can include a minimum noise figure ($F_{min}$) associated with the first gain stage, a source reflection coefficient ($\Gamma_O$) for minimum noise, and the normalized noise resistance ($r_n$) at minimum noise. In some embodiments, the parameters of the first gain stage can be determined based on user input. In another embodiment, the parameters of the first gain stage can be determined based on a look-up table of possible devices that can be employed and the corresponding bias conditions. For example, based on knowledge of the device type (e.g., a low noise amplifier) and bias conditions (e.g., a bias voltage, a bias current), the look-up table can be accessed and the corresponding parameters of the first gain stage can be identified. The flow continues at block 304.

At block 304, a stability factor is calculated based, at least in part, on the parameters of the first gain stage. For example, the optimization engine 125 can calculate the stability factor of the first gain stage 102. In some embodiments, the optimization techniques described herein may be implemented if the first gain stage is determined to be stable. Therefore, the stability factor (K) and $\Delta_S$ can be calculated for the first gain stage 102 based, at least in part, on the S-parameters of the first gain stage 102 as described above with reference to Eq. 15, Eq. 16, and Eq. 17. The flow continues at block 306.

At block 306, it is determined whether the first gain stage is stable. For example, the stability factor calculated at block 304 can be compared against a predetermined threshold to determine whether the first gain stage 102 is stable. With reference to Eq. 15, it can be determined whether the amplifier stability factor (K) is greater than 1 (e.g., a predetermined threshold) and also whether the absolute value of the parameter $|\Delta_S|$ is less than 1 (e.g., a second predetermined threshold). If K>1 and $|\Delta_S|$<1, then this indicates that the first gain stage is stable. With reference to Eq. 17, it can be determined whether the stability parameter ($\rho$) is greater than 1 (e.g., a predetermined threshold). If it is determined that the first gain stage is stable, the flow continues at block 308. If it is determined that the first gain stage is not stable, the flow ends.

At block 308, a maximum noise figure associated with the first stage is determined and a plurality of noise figure increments between the minimum noise figure and the maximum noise figure are determined. In some embodiments, the optimization engine 125 can determine the maximum noise figure based on user input. In other embodiments, the optimization engine 125 can automatically select the maximum noise figure so that the maximum noise figure is greater than the minimum noise figure (determined at block 302) by a predetermined increment (e.g., the minimum noise figure+2 dB) or a predetermined percentage (e.g., 10% greater than the minimum noise figure). Additionally, a plurality of noise figure increments between the minimum noise figure and the maximum noise figure are determined. In some embodiments, a user may specify a number of noise figure increments or the value of each noise figure increment. In other embodiments, the number of noise figure increments can be preconfigured. In other embodiments, other suitable techniques for selecting/determining the noise figure increments can be employed. If P represents the total number of noise figure increments, the value of noise figure increment ($F_i$) can be calculated as $F_i=(F_{max}-F_{min})/(P+1)$. The flow continues at block 310.

At block 310, a current noise figure is determined based on the noise figure increment and the minimum noise figure. For example, at the $i^{th}$ iteration where the noise figure increment is $F_i$, the optimization engine 125 can calculate the current noise figure (F) as $F=F_{min}+(i-1)F_i$. The flow continues at block 312.

At block 312, it is determined whether the current noise figure is less than the maximum noise figure. In some embodiments, the optimization engine 125 can determine whether the current noise figure is less than the sum of the maximum noise figure and the noise figure increment. In other words, at block 312, it can be determined whether $F<F_{max}+F_i$. If it is determined that the current noise figure is less than the maximum noise figure, the flow continues at block 314. Otherwise, the flow continues at block 316.

At block 314, noise figure circle data is computed. The flow 300 moves from block 312 to block 314 if it is determined that the current noise figure is less than the maximum noise figure. A noise circle can be a locus of points with a constant noise figure (i.e., at the current noise figure) but a different gain value as depicted in FIG. 5. The noise figure circle data is determined in accordance with Eq. 24, 25, and 26. The noise figure circle data is then stored at a suitable memory location. From block 314, the flow loops back to block 310 where the current noise figure is incremented and the next noise figure to be analyzed is determined.

At block 316, a gain value associated with the current noise figure is determined at each of the noise figure increments.

The flow 300 moves from block 312 to block 316 if it is determined that the current noise figure exceeds the maximum noise figure. The gain value that corresponds each of the noise figure values to be analyzed can be determined by first determining a plurality of gain circles using Eq. 18-22 and solving these equations for the gain value ($g_A$) that corresponds to the noise figure values to be analyzed. The flow continues at block 318 in FIG. 4.

At block 318, at each of the noise figure increments, an optimum source reflection coefficient is determined and a noise figure and a gain value associated with the computed source reflection coefficient are stored. The source reflection coefficient can be expressed as $\Gamma_S = U_S + jV_S$. The values of $U_S$ and $V_S$ can be determined by solving the non-linear equations Eq. 28 and Eq. 29. In solving Eq. 28 and Eq. 29, the intersection of the gain circle (represented by Eq. 28) and the noise figure circle (represented by Eq. 29) can be determined. FIG. 5 depicts the relationship between a gain circle and a noise figure circle on a Smith chart. The gain circle (calculated in accordance with Eqs. 20 and 22) has a center at ($U_A$, $V_A$) and radius $R_A$. The noise figure circle (calculated in accordance with Eqs. 25 and 26) has a center at ($U_N$, $V_N$) and radius $R_N$. The intersection of the two circles can be referred to as a "tangent point." The tangent point occurs at ($U_S$, $V_S$) and represents the optimum source reflection coefficient ($\Gamma_{S\_opt}$). The noise figure and the gain value that correspond to the optimum source reflection coefficient are referred to as the optimum noise figure ($F_{i\_opt}$) and the optimum gain value ($G_{A\_opt}$) respectively. The flow continues at block 320.

At block 320, at each of the noise figure increments, a second stage noise figure is determined. In some embodiments, the second stage noise figure ($F_2$) may be selected so that it satisfies the condition depicted below in Eq. 32. In some embodiments, the second stage noise figure can be determined so that it is always greater than the first stage noise figure. In some embodiments, the second stage noise figure can be selected so that it is greater than the first stage noise figure by a predetermined value (e.g., by 1 dB) or by a predetermined percentage (e.g., by 10% of the first stage noise figure). In some embodiments, the value of the second stage noise figure may vary depending on the bias condition associated with the second gain stage. The flow continues at block 322.

$$F_{i\_opt} + \frac{F_2 - 1}{G_{A\_opt}} \leq F_{min} + \frac{F_2 - 1}{G_A} \qquad \text{Eq. 32}$$

At block 322, at each of the noise figure increments, a cascade noise figure associated with the first and the second stages of the cascade gain device. For example, the optimization engine 125 can determine the cascade noise figure based on the optimum noise figure at the noise figure value, the corresponding optimum gain value, and the corresponding second stage noise figure as depicted by Eq. 33. The flow continues at block 324.

$$F_{tot} = F_{i\_opt} + \frac{F_2 - 1}{G_{A\_opt}} \qquad \text{Eq. 33}$$

At block 324, a target source reflection coefficient, a corresponding target noise figure, and a corresponding target gain are selected for the first gain stage. In some embodiments, the optimum source reflection coefficient that corresponds to the smallest noise figure can be selected as the target source reflection coefficient. Also, in this embodiment, the optimum noise figure and the optimum gain that minimize the cascade noise figure can be selected as the target noise figure and the target gain respectively. In other words, the triplet ($\Gamma_{s,opt}$, $F_{i\_opt}$, $G_{A\_opt}$) is identified so that $F_{tot}$=minimum. In another embodiment, the optimum source reflection coefficient that corresponds to the highest gain can be selected as the target source reflection coefficient. Also, in this embodiment, the optimum noise figure and the optimum gain that maximize the cascade gain can be selected as the target noise figure and the target gain respectively. In other words, the triplet ($\Gamma_{s,opt}$, $F_{i\_opt}$, $G_{A\_opt}$) is identified so that $$F_{tot} = F_{min} + \frac{F_2 - 1}{G_A} = F_{tot\_original}.$$

In this embodiment, the triplet ($\Gamma_{s,opt}$, $F_{i\_opt}$, $G_{A\_opt}$) can be identified so that target noise figure ($F_{tot}$) is equal to the un-optimized target noise figure but at the highest available gain. Thus, if no optimization was performed, the total cascade noise figure is $F_{tot} = F_{tot\_non\_optimum}$. After optimization, the total cascade noise figure may still be $F_{tot} = F_{tot\_non\_optimum}$ but the total cascade gain is maximized without increasing the noise figure over the original non-optimized design. It should be noted that the triplet ($\Gamma_{s,opt}$, $F_{i\_opt}$, $G_{A\_opt}$) identified for the minimum cascade noise figure condition is typically different from the triplet ($\Gamma_{s,opt}$, $F_{i\_opt}$, $G_{A\_opt}$) identified for the maximum cascade gain condition. In some embodiments (as will be further described below), a mismatch loss analysis can be performed prior to selecting the noise figure, the corresponding gain value, and the corresponding source reflection coefficient to ensure that too much received power is not reflected away from subsequent processing components. For example, mismatch loss difference associated with each source reflection coefficient can be compared against a corresponding gain increment and the source reflection coefficient may be selected from those that are associated with a mismatch loss difference that is less than the gain increment. The flow continues at block 326.

At block 326, a target load reflection coefficient is calculated for the first gain stage. For example, the optimization engine 125 can calculate the target load reflection coefficient ($\Gamma_L$) based on the S-parameters associated with the first gain stage and the target source reflection coefficient, as depicted with reference to Eq. 14. The flow continues at block 328.

At block 328, parameters of an inter-stage matching network are configured based on the target source reflection coefficient, the target load reflection coefficient, the optimum noise figure, and the optimum gain of the first gain stage. As described above with reference to block 225 of FIG. 2, the inter-stage matching network can be implemented between the first gain stage and the second gain stage and can be adjusted to achieve the optimum noise figure and the optimum gain of the first gain stage, thereby providing an optimized cascade gain device. In some embodiments, one or more components of the inter-stage matching network may be dynamically adjusted to set the reflection coefficient and to consequently achieve the optimum noise figure and the optimum gain of the first gain stage. In other embodiments, the inter-stage matching network may be adjusted during the fabrication of the cascade gain device. From block 328, the flow ends.

It should be understood that in some embodiments, increasing the gain (or decreasing noise figure) of the first gain stage may have some adverse effects due to the selected target source reflection coefficient $\Gamma_s$. Therefore, the VSWR, return loss, and/or mismatch loss may be tracked and analyzed to select the source reflection coefficient, the noise figure, and the gain that can best optimize the cascade amplifier. Typically, the gain increase due to the increased first noise figure must be greater than the mismatch loss (ML) given by Eq. 34 to achieve a true net gain. As depicted by Eq. 34, the mismatch loss can be calculated based on the source reflection coefficient ($\Gamma_s$). The mismatch loss can be calculated for each of the optimum source reflection coefficients (associated with corresponding ones of the noise figure increments). Also, the mismatch loss difference ($\Delta ML$) can be calculated for each of the optimum source reflection coefficients (associated with corresponding ones of the noise figure increments) in accordance with Eq. 35. In Eq. 35, $ML_{F_{min}}$ represents the mismatch loss at the source reflection coefficient that corresponds to the minimum noise figure.

$$ML = 10 \log_{10}(1-|\Gamma_s|^2) \qquad \text{Eq. 34}$$

$$\Delta ML = |ML - ML_{F\_min}| \qquad \text{Eq. 35}$$

Analyzing the mismatch loss can ensure the selected source reflection coefficient is within acceptable limits and does not result in too much received power being reflected away from subsequent processing components. In addition, a gain increment ($\Delta G$) can also be calculated. For each potential optimum source reflect coefficient to be analyzed, the gain increment can be calculated as the difference between the gain that corresponds to the optimum source reflection coefficient under consideration and the original gain of the first gain stage. The mismatch loss difference ($\Delta ML$) can be compared against the gain increment ($\Delta G$) to ensure that the amount of power reflected does not exceed the increase in gain. Those of the optimum source reflection coefficients where the mismatch loss difference is greater than the gain increment may not be considered in selecting the target source reflection coefficient. From those optimum source reflection coefficients where the mismatch loss difference is less than the gain increment, the target source reflection coefficient (and corresponding target noise figure and target gain) may be selected depending on whether a minimum cascade noise condition or a maximum cascade gain condition is to be satisfied.

It should be understood that FIGS. 1-5 are examples meant to aid in understanding embodiments and should not be used to limit embodiments or limit the scope of the claims. Embodiments may comprise additional circuit components, different circuit components, and/or may perform additional operations, fewer operations, operations in a different order, operations in parallel, and some operations differently. For example, although the Figures describe operations for incrementing the noise figure and then computing the corresponding maximum amplifier gain for that noise figure, embodiments are not so limited. In other embodiments, the gain can be incremented and the corresponding minimum noise figure for that gain can be calculated using the same formulation.

Although the Figures describe operations for optimizing the noise figure and the gain across a two-stage cascade amplifier, embodiments are not so limited. In other embodiments, the operations described herein can be extended to a cascade amplifier that comprises any suitable number of amplifier stages. For example, for a 3-stage cascade amplifier, optimization operations described herein can be executed for the first and the second stages. Next, the combination of the first and second amplifier stages can be considered to be a new first stage with the determined optimum noise figure and optimum gain. The optimization operations can then be repeated for the new first stage and the third amplifier stage. Furthermore, the operations described herein need not be applied to two amplifier stages beginning at the first amplifier stage and the second amplifier stage. Instead, the operations described herein can be applied to any two amplifier stages positioned anywhere along the cascade chain. However, the observation can be made that beyond the second amplifier stage of an amplifier chain, the contribution to the overall noise figure is typically limited, reducing the problem to the optimization of the first amplifier stage as considered here. In some embodiments where the noise figure of the first and the second amplifier stages set the cascade noise figure of the cascade amplifier, the optimization process may begin at the first and the second amplifier stages of the cascade amplifier (as described herein). However, embodiments are not so limited. In other embodiments where the second amplifier stage is a passive device, the optimization process may begin after the second stage (e.g., beginning at the third and the fourth amplifier stages). In another embodiment, the optimization process may begin at the last and second-to-last amplifier stages of the cascade amplifier and may proceed backwards.

In some embodiments, the optimization techniques described above can be extended for noise temperature formulation. The cascade noise temperature can be expressed in a format that is similar to the cascade noise figure. If $T_i$ represents the noise temperature of the $i^{th}$ amplifier stage, the cascade noise temperature (T) can be represented as $$T = T_1 + \frac{T_2}{G_1} + \frac{T_3}{G_1 G_2} + \dots .$$

Accordingly, the equations and process described above can be extended to minimize cascade noise temperature.

It should be noted that the S-parameters of a device are generally determined under some bias condition. Therefore, in some embodiments, the S-parameters of the device may be considered to be another degree of freedom in the above-described process. For example, the optimum S-parameters and optimum noise parameters can be determined for lower voltage operation and to conserve power. In some embodiments, a look-up table can be employed to identify the optimum parameters of the inter-stage matching network based on bias conditions (e.g., bias voltage, bias current, etc.) and device type. It should be noted that in other embodiments, other suitable parameters can be selected for optimizing the cascade gain device.

It should be understood that the operations described herein can depend on the noise figure increment value. In some embodiments, multiple iterations of the above-described operations can be executed to narrow in on the target source reflection coefficient that is to be implemented by the first gain stage. In other words, lower resolution noise figure increment values can be employed for the first iteration of the optimization process. At subsequent iterations of the optimization process, the resolution can then be increased around the solutions of the previous iteration. For example, minimum cascade noise and maximum cascade gain solutions can be determined using an initial noise figure increment $F_i$. At the next iteration, the initial noise figure increment can be decreased and the process can be repeated over a smaller range of solutions (around the minimum cascade noise and/or the maximum cascade gain solutions).

Although the Figures describe optimization techniques for a cascade amplifier comprising multiple amplifier stages, embodiments are not so limited. In other embodiments, the optimization techniques described herein can be employed for a cascade gain device, where the cascaded gain stages can be mixers, biased transistors, and other suitable positive or negative gain devices. For example, the first gain stage may be a low noise amplifier (LNA) and the second gain device may be a mixer unit with a loss (i.e., negative gain). However, both the LNA and the mixer are associated with their respective noise figure. In this example, the cascade gain device can be optimized to reduce the cascade noise figure or to improve the gain of the LNA. In some embodiments, increasing the gain and noise figure of an amplifier stage can affect its non-linear performance. For example, spurious free dynamic range (SFDR) associated with the amplifier stage may be reduced. In some embodiments, the decrease in SFDR can be controlled by increasing the noise figure of the second gain stage (i.e., by selecting a higher value of $F_2$ at block 320 of FIG. 4).

Lastly, it should be noted that although FIG. 3 depicts the optimization operations being performed only if the first gain stage is unconditionally stable (e.g., at block 306 the flow ends if the first gain stage is not stable), embodiments are not so limited. In other embodiments, the optimization operations described herein may be executed even if the first gain stage is potentially unstable (i.e., conditionally stable). For this, the process can ensure that the optimum solutions (e.g., the optimum source reflection coefficient, the corresponding optimum noise figure, and the corresponding optimum gain) do not lie within (or substantially close to) the region of instability (e.g., of the Smith chart). The region of instability may be calculated using any suitable classical microwave amplifier design techniques. The solutions (i.e., the optimum source reflection coefficient values) that lie within the region of instability can be discarded.

Embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein. A machine-readable medium includes any mechanism for storing ("machine-readable storage medium") or transmitting ("machine-readable signal medium") information in a form (e.g., software, processing application) readable by a machine (e.g., a computer). The machine-readable storage medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions (e.g., executable by one or more processing units). In addition, machine-readable signal medium embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

Figure 6:
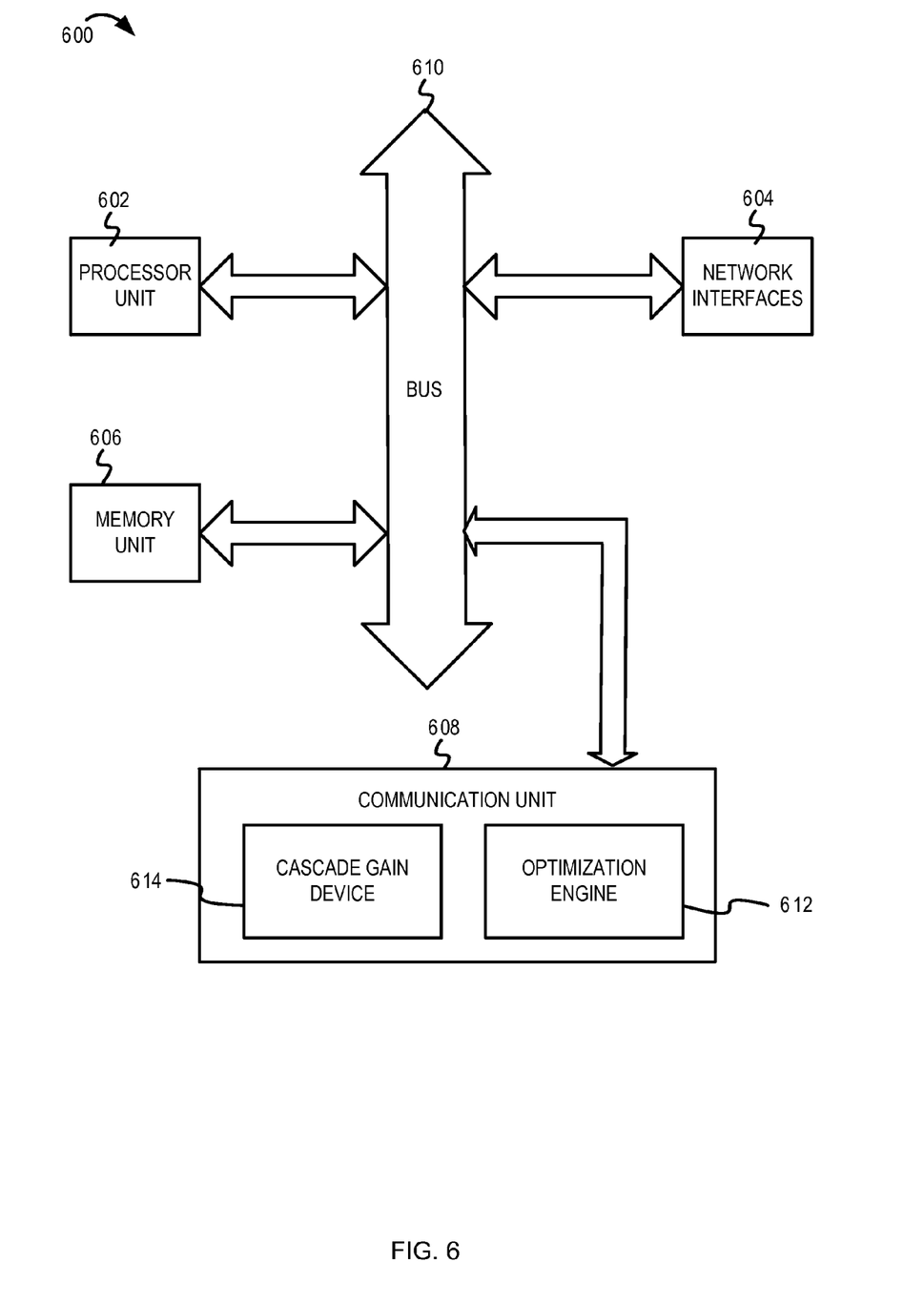
FIG. 6 is a block diagram of one embodiment of an electronic device including a cascade gain device optimization mechanism.

FIG. 6 is a block diagram of one embodiment of an electronic device 600 including a cascade gain device optimization mechanism. In some implementations, the electronic device 600 may be one of a notebook computer, a desktop computer, a tablet computer, a netbook, a mobile phone, a gaming console, a smart appliance, or other electronic systems comprising device communication unit with wireless (and/or wired) communication capabilities (e.g., WLAN 802.11). The electronic device 600 includes a processor unit 602 (possibly including multiple processors, multiple cores, multiple nodes, and/or implementing multi-threading, etc.). The electronic device 600 includes a memory unit 606. The memory unit 606 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable storage media. The electronic device 600 also includes a bus 610 (e.g., PCI, ISA, PCI-Express, HyperTransport®, InfiniBand®, NuBus, AHB, AXI, etc.), and network interfaces 604 that include at least one of a wireless network interface (e.g., a WLAN interface, a Bluetooth® interface, a WiMAX interface, a ZigBee® interface, a Wireless USB interface, etc.) and a wired network interface (e.g., an Ethernet interface, a powerline interface, etc.).

The electronic device 600 also includes a communication unit 608. The communication unit 608 comprises an optimization engine 612 and a cascade gain device 614. The cascade gain device 614 can comprise two or more gain stages and inter-stage matching networks as depicted with reference to FIG. 1. The optimization engine 612 can execute functionality for computing control settings for the gain stages to satisfy a minimum cascade noise figure condition or a maximum cascade gain condition. The optimization engine 612 can also adjust parameters of the inter-stage matching networks in accordance with the determined control settings to optimize performance of the cascade gain device 614, as described above with reference to FIGS. 1-5. Any one of these functionalities may be partially (or entirely) implemented in hardware and/or on the processor unit 602. For example, the functionality may be implemented with an application specific integrated circuit, in logic implemented in the processor unit 602, in a co-processor on a peripheral device or card, etc. Further, realizations may include fewer or additional components not illustrated in FIG. 6 (e.g., video cards, audio cards, additional network interfaces, peripheral devices, etc.). The processor unit 602, the memory unit 606, and the network interfaces 604 are coupled to the bus 610. Although illustrated as being coupled to the bus 610, the memory unit 606 may be coupled to the processor unit 602.

While the embodiments are described with reference to various implementations and exploitations, it will be understood that these embodiments are illustrative and that the scope of the inventive subject matter is not limited to them. In general, techniques for implementing an optimized cascade gain device as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

The invention claimed is:

1. A method for optimizing a cascade gain device, the method comprising:
determining a first noise figure associated with a first gain stage of the cascade gain device, wherein the cascade gain device comprises at least the first gain stage and a second gain stage;
determining a plurality of noise figure increments associated with the first gain stage;
incrementally increasing the first noise figure of the first gain stage by the noise figure increments associated with the first gain stage;
for each of the plurality of noise figure increments, determining a gain value that corresponds to the noise figure increment;
selecting a first noise figure increment from the plurality of noise figure increments and a first gain value corresponding to the first noise figure increment; and
configuring a parameter of an inter-stage matching network associated with the first gain stage and the second gain stage based, at least in part, on the first noise figure increment of the first gain stage and the first gain value corresponding to the first noise figure increment of the first gain stage.

2. The method of claim 1, wherein said selecting the first noise figure increment and the first gain value corresponding to the first noise figure increment is based, at least in part, on a cascade noise figure associated with the cascade gain device.

3. The method of claim 1, wherein the inter-stage matching network associated with the first gain stage and the second gain stage is coupled between the first gain stage and the second gain stage of the cascade gain device.

4. The method of claim 1, wherein for each of the plurality of noise figure increments, determining the gain value that corresponds to the noise figure increment comprises:
for each of the plurality of noise figure increments, determining the gain value and a source reflection coefficient that corresponds to the noise figure increment.

5. The method of claim 4, wherein said configuring the parameter of the inter-stage matching network associated with the first gain stage and the second gain stage further comprises:
selecting the source reflection coefficient that corresponds to the first noise figure increment of the first gain stage as a first source reflection coefficient of the first gain stage;
determining a load reflection coefficient of the first gain stage based, at least in part, on the first source reflection coefficient of the first gain stage; and
adjusting the parameter of the inter-stage matching network based, at least in part, on the first source reflection coefficient and the load reflection coefficient of the first gain stage to achieve the first noise figure increment of the first gain stage and the first gain value corresponding to the first noise figure.

6. The method of claim 1, wherein the first noise figure is a minimum noise figure associated with the first gain stage.

7. The method of claim 1, wherein the second gain stage is associated with a second noise figure, wherein the second gain stage follows the first gain stage, wherein the second noise figure of the second gain stage is greater than the first noise figure of the first gain stage, wherein the second noise figure of the second gain stage satisfies:

$$F_2 \geq \left(\frac{b}{b-1}\right)(a-1)G_1 F_1 + 1$$

where,
$F_1$ is the first noise figure increment;
$G_1$ is the first gain value corresponding to the first noise figure increment;
$F_2$ is the second noise figure of the second gain stage;
a is an increase in the first noise figure increment of the first gain stage; and
b is an increase in gain of the first gain stage resulting from the increase in the first noise figure increment of the first gain stage.

8. The method of claim 1, wherein said selecting the first noise figure increment and the first gain value corresponding to the first noise figure increment comprises:
identifying a noise figure increment from the plurality of noise figure increments and a gain value that corresponds to the noise figure increment such that the cascade gain device is associated with a minimum cascade noise figure and a cascade gain that is greater than or equal to an initial cascade gain.

9. The method of claim 8, further comprising selecting the first noise figure increment and the first gain value corresponding to the first noise figure increment of the first gain stage to satisfy:

$$aF_1 + \frac{F_2 - 1}{bG_1} = \text{minimum cascade noise figure}$$

wherein,
$F_1$ is the first noise figure increment;
$G_1$ is the first gain value corresponding to the first noise figure increment;
$F_2$ is a second noise figure associated with the second gain stage;
a is an increase in the first noise figure increment; and
b is an increase in the first gain value resulting from the increase in the first noise figure increment of the first gain stage.

10. The method of claim 1, wherein said selecting the first noise figure increment and the first gain value corresponding to the first noise figure increment comprises:

selecting the first noise figure increment and the first gain value corresponding to the first noise figure such that the cascade gain device is associated with a maximum cascade gain and a cascade noise figure that is less than or equal to an initial cascade noise figure.

11. The method of claim 10, wherein the initial cascade noise figure of the cascade gain device is calculated as a sum of the first noise figure associated with the first gain stage and a noise figure contribution from the second gain stage when the first gain stage is operating at the first noise figure.

12. The method of claim 11, further comprising selecting the first noise figure increment and the first gain value corresponding to the first noise figure increment to satisfy:

$$aF_1 + \frac{F_2 - 1}{bG_1} = F_1 + \frac{F_2 - 1}{G_1}$$

wherein,
$F_1$ is the first noise figure increment;
$G_1$ is the first gain value corresponding to the first noise figure increment;
$F_2$ is a second noise figure associated with the second gain stage;
a is an increase in the first noise figure increment; and
b is an increase in gain of the first gain value resulting from the increase in the first noise figure increment of the first gain stage.

13. The method of claim 1, wherein, when the cascade gain device comprises a third gain stage following the second gain stage, the method further comprises:
designating a combination of the first gain stage and the second gain stage as a combined gain stage; and
executing optimization operations for the combined gain stage and the third gain stage to optimize the cascade gain device.

14. The method of claim 1, further comprising:
determining a stability factor associated with the first gain stage based, at least in part, on a device parameter of the first gain stage;
determining whether the stability factor associated with the first gain stage satisfies a predetermined stability threshold;
in response to determining that the stability factor associated with the first gain stage satisfies the predetermined stability threshold, executing optimization operations for the cascade gain device by said incrementally increasing the first noise figure of the first gain stage by the noise figure increments associated with the first gain stage; and
in response to determining that the stability factor associated with the first gain stage does not satisfy the predetermined stability threshold, determining not to execute the optimization operations for the cascade gain device.

15. The method of claim 14, wherein the device parameter of the first gain stage comprises at least one of a scattering (S) parameter of the first gain stage, a minimum noise figure associated with the first gain stage, a source reflection coefficient that corresponds to the minimum noise figure, and a noise resistance of the first gain stage, wherein the device parameter is associated with a bias condition.

16. The method of claim 15, further comprising:
varying the bias condition associated with the first gain stage to vary the device parameter associated with the first gain stage; and executing optimization operations for the cascade gain device by said incrementally increasing the first noise figure of the first gain stage by the noise figure increments in response to said varying the bias condition associated with the first gain stage.

17. The method of claim 1, wherein the first gain stage comprises at least one of an amplifier, a filter unit, and a mixer unit, and the second gain stage comprises at least one of an amplifier, a filter unit, and a mixer unit.

18. The method of claim 1, wherein said selecting the first noise figure increment of the plurality of noise figure increments and the first gain value corresponding to the first noise figure increment further comprises:
selecting the first noise figure increment of the first gain stage and the first gain value corresponding to the first noise figure increment of the first gain stage respectively such that a stability factor associated with the first gain stage satisfies a predetermined stability threshold, wherein the stability factor is determined based, at least in part, on a device parameter of the first gain stage.

19. A communication device comprising:
a cascade gain device comprising at least a first gain stage and a second gain stage;
an inter-stage matching network associated with the first gain stage and the second gain stage; and
an optimization unit coupled with the cascade gain device and the inter-stage matching network, the optimization unit configured to:
determine a first noise figure associated with the first gain stage of the cascade gain device;
determine a plurality of noise figure increments associated with the first gain stage;
incrementally increase the first noise figure of the first gain stage by the noise figure increments associated with the first gain stage;
determine, for each of the plurality of noise figure increments, a gain value that corresponds to the noise figure increment;
select a first noise figure increment and a first gain value corresponding to the first noise figure increment; and
determine a parameter of the inter-stage matching network associated with the first gain stage and the second gain stage based on the first noise figure increment of the first gain stage and the first gain value corresponding to the first noise figure increment.

20. The communication device of claim 19, wherein the inter-stage matching network associated with the first gain stage and the second gain stage is coupled between the first gain stage and the second gain stage of the cascade gain device.

21. The communication device of claim 19,
wherein, the optimization unit configured to determine, for each of the plurality of noise figure increments the gain value that corresponds to the noise figure increment comprises the optimization unit configured to:
determine, for each of the plurality of noise figure increments, the gain value and a source reflection coefficient that corresponds to the noise figure increment; and
wherein the optimization unit configured to determine a parameter of the inter-stage matching network associated with the first gain stage and the second gain stage based on the first noise figure increment and the first gain value corresponding to the first noise figure increment further comprises the optimization unit configured to:

select the source reflection coefficient that corresponds to the first noise figure increment as a first source reflection coefficient of the first gain stage;

determine a load reflection coefficient of the first gain stage based, at least in part, on the first source reflection coefficient of the first gain stage; and adjust the parameter of the inter-stage matching network based, at least in part, on the first source reflection coefficient and the load reflection coefficient of the first gain stage to achieve the first noise figure increment of the first gain stage and the first gain value corresponding to the first noise figure increment.

22. The communication device of claim 19, wherein the optimization unit configured to select the first noise figure increment and the first gain value corresponding to the first noise figure increment further comprises the optimization unit configured to:

identify a noise figure increments from the plurality of noise figure increments and a corresponding gain value that corresponds to the noise figure increment such that the cascade gain device is associated with a minimum cascade noise figure and a cascade gain that is greater than or equal to an initial cascade gain.

23. The communication device of claim 19, wherein the optimization unit configured to select the first noise figure increment and the first gain value corresponding to the first noise figure increment comprises the optimization unit configured to:

select the first noise figure increment and the first gain value corresponding to the first noise figure increment such that the cascade gain device is associated with a maximum cascade gain and a cascade noise figure that is less than or equal to the an initial cascade noise figure.

24. The communication device of claim 19, wherein, when the cascade gain device comprises a third gain stage following the second gain stage, the optimization unit is further configured to:

designate a combination of the first gain stage and the second gain stage as a combined gain stage; and execute optimization operations for the combined gain stage and the third gain stage to optimize the cascade gain device.

25. The communication device of claim 19, wherein the optimization unit is further configured to:

determine a stability factor associated with the first gain stage based, at least in part, on a device parameter of the first gain stage;

determine whether the stability factor associated with the first gain stage satisfies a predetermined stability threshold;

execute optimization operations for the cascade gain device by incrementally increasing the first noise figure of the first gain stage by the noise figure increments associated with the first gain stage in response to the optimization unit determining that the stability factor associated with the first gain stage satisfies the predetermined stability threshold; and determine not to execute the optimization operations for the cascade gain device in response to the optimization unit determining that the stability factor associated with the first gain stage does not satisfy the predetermined stability threshold.

26. A machine-readable storage media having instructions stored therein, which when executed by a processor causes the processor to perform operations that comprise:

determining a first noise figure associated with a first gain stage of a cascade gain device, wherein the cascade gain device comprises at least the first gain stage and a second gain stage;

determining a plurality of noise figure increments associated with the first gain stage;

incrementally increasing the first noise figure of the first gain stage by the noise figure increments associated with the first gain stage;

for each of the plurality of noise figure increments, determining a gain value that corresponds to the noise figure increment;

selecting a first noise figure increment from the plurality of noise figure increments and a first gain value corresponding to the first noise figure increment; and configuring a parameter of an inter-stage matching network associated with the first gain stage and the second gain stage based on the first noise figure increment of the first gain stage and the first gain value corresponding to the first noise figure increment.

27. The machine-readable storage media of claim 26, wherein for each of the plurality of noise figure increments, said operation of determining the gain value that corresponds to the noise figure increment comprises:

for each of the plurality of noise figure increments, determining the gain value and a source reflection coefficient that corresponds to the noise figure increment; and wherein said operation of configuring the parameter of the inter-stage matching network associated with the first gain stage and the second gain stage further comprises:

selecting the source reflection coefficient that corresponds to the first noise figure increment of the first gain stage as a first source reflection coefficient of the first gain stage;

determining a load reflection coefficient of the first gain stage based, at least in part, on the first source reflection coefficient of the first gain stage; and adjusting the parameter of the inter-stage matching network based, at least in part, on the first source reflection coefficient and the load reflection coefficient of the first gain stage to achieve the first noise figure increment of the first gain stage and the first gain corresponding to the first noise figure increment.

28. The machine-readable storage media of claim 26, wherein said operation of selecting the first noise figure increment from the plurality of noise figure increments and the first gain value corresponding to the first noise figure increment comprises:

selecting a noise figure increment from the plurality of noise figure increments and a gain value that corresponds to the noise figure increment such that the cascade gain device is associated with a maximum cascade gain and a cascade noise figure that is less than or equal to the an initial cascade noise figure.

29. The method of claim 1, further comprising determining the plurality of noise figure increments based, at least in part, on a minimum noise figure and a maximum noise figure associated with the first gain stage.

30. The communication device of claim 19, wherein the optimization unit is further configured to determine the noise figure increments based, at least in part, on a minimum noise figure and a maximum noise figure associated with the first gain stage.

31. The machine-readable storage media of claim 26, wherein said operation for incrementally increasing the first noise figure of the first gain stage by the noise figure increments associated with the first gain stage further comprises determining the noise figure increments based, at least in part, on a minimum noise figure and a maximum noise figure associated with the cascade gain device.

32. The machine-readable storage media of claim 26, wherein said operation for selecting the first noise figure increment from the plurality of noise figure increments and the first gain value corresponding to the first noise figure increment is based, at least in part, on a cascade noise figure associated with the cascade gain device or a cascade gain value associated with the cascade gain device.

* * * * *